US006621343B2

(12) United States Patent  (10) Patent No.: US 6,621,343 B2
Hart  (45) Date of Patent: Sep. 16, 2003

(54) OPEN LOOP VARIABLE GAIN AMPLIFIER USING REPLICA GAIN CELL

(75) Inventor: Siegfried Hart, Santa Cruz, CA (US)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/924,836

(22) Filed: Aug. 7, 2001

(65)  Prior Publication Data

US 2003/0030491 A1 Feb. 13, 2003

(51) Int. Cl.$^7$ ................................................. H03F 3/45
(52) U.S. Cl. ....................... 330/254; 330/133; 330/134; 330/258
(58) Field of Search ................................. 330/133, 134, 330/254, 258

(56)  References Cited

U.S. PATENT DOCUMENTS 6,081,162 A * 6/2000 Johnson ...................... 330/301
6,452,449 B1 * 9/2002 Saito

FOREIGN PATENT DOCUMENTS

JP  4030612  *  2/1992 ................. 330/254

OTHER PUBLICATIONS

Rijns "CMOS Low–Distortion High–Frequency Variable–Gain Amplifier", IEEE Journal of Solid–State Circuits, vol. 31, No. 7 Jul. 1996 pp 1029–1034.*
"Synchronous Recording Channels—PRML & Beyond", rev. 5.61 14.E.18, 1999, published by Knowledge Tek, Inc., Broomfield, Colorado.
"PRML: Seagate Uses Space Age Technology" available on the Internet at http://www.seagate.com/support/kb/disc/prml.html, 2 pages, last accessed Apr. 9, 2001.
"Technologies—PRML" available on the Internet at http://www.idema.org/about/industry/ind_tech_prml.html, 1 page, last accessed Apr. 9, 2001.

"Reference Guide—Hard Disk Drives" available on the Internet at http://www.storagereview.com/guide2000/ref/hdd, 13 pages, last accessed Apr. 9, 2001.
"MR and PRML: Technologies in Synergy" available at on the Internet at http://www.lionsgate.com/Home/Baden/public_html_index/SCSI/Quantum_White_Papers/MR_Head/MR, 4 pages, last accessed Apr. 9, 2001.
"A Tutorial on Convolutional Coding with Viterbi Decoding" available on the Internet at http://pw1.netcom.com/~chip.f/viterbi/tutorial.html, 10 pages, last accessed Apr. 9, 2001.
Rijins, J. J. F. "CMOS Low–Distortion High–Frequency Variable–Gain Amplifier", IEEE Journal of Solid–State Circuits, vol. 31, No. 17, Jul. 1999, pp 1029–1034.

* cited by examiner

Primary Examiner—Michael B Shingleton
(74) Attorney, Agent, or Firm—Brinks Hofer Gilson & Lione

(57)  ABSTRACT

A variable gain amplifier ("VGA") having an open loop architecture is disclosed. The VGA includes one or more gain cells coupled in the signal path to amplify a given input signal. The VGA further includes a replica gain cell having a gain servo circuit which amplifies a gain reference signal according to a programmable gain input and equalizes the amplified reference signal to the original unamplified reference signal, continuously generating a gain control input to the signal path gain cells based on the equalization. This gain control input reflects the gain set by the programmable gain input as adjusted for process, temperature and supply voltage variations. The replica gain cell further includes a common mode voltage servo circuit which senses the common mode voltage of the amplified reference signal and equalizes it to a common mode voltage reference, generating a common mode voltage control signal to the signal path gain cells to regulate their common mode voltage. This regulation of the common mode voltage of the signal path gain cells is compensated for process, temperature and supply voltage variations.

27 Claims, 10 Drawing Sheets mable gain cell for use with the circuit of FIG. 5.

OPEN LOOP VARIABLE GAIN AMPLIFIER USING REPLICA GAIN CELL

BACKGROUND

An important analog building block, especially in analog signal processing systems, is the variable gain amplifier ("VGA"). VGA circuits are necessary components in many signal processing and data acquisition systems which typically include analog-to-digital ("A/D") converters. The use of a VGA at the front of a data converter, such as an A/D converter, is usually preferred to best utilize the converter's dynamic input range.

As signal processing speeds continue to rise, the need for continually faster data converters, and therefore also faster VGA's, arises as well. Unfortunately, typical VGA's suffer from operating speed and bandwidth limitations due to their circuit design. Further, the operational parameters of such VGA's are sensitive to process tolerance, temperature and supply voltage variation. This further limits the use of these VGA's with smaller process and/or lower voltage technologies.

Accordingly, there is a need for a variable gain amplifier which operates at high speed and with a wide bandwidth and with operational parameters that are insensitive to process tolerance, temperature and supply voltage variations.

SUMMARY

The present invention is defined by the following claims, and nothing in this section should be taken as a limitation on those claims. By way of introduction, the preferred embodiments described below relate to a variable gain amplifier ("VGA"). The VGA includes at least one signal path gain cell characterized by an open loop architecture and operative to amplify a differential input signal by a first gain according to a gain control signal, and a replica gain cell coupled with the at least one signal path gain cell and a gain input and operative to amplify a first reference signal according to the gain input and generate the gain control signal.

The preferred embodiments further relate to a method of amplifying a signal.

In one embodiment, the method includes applying a gain control value to a replica gain cell corresponding to a selected gain of a signal path gain cell, applying a first reference signal to the replica gain cell to be amplified, equalizing, substantially, the amplified first reference signal to the first reference signal, deriving an adjusted gain control signal based on the equalizing, and applying the adjusted gain control signal to the signal path gain cell to achieve the selected gain.

Further aspects and advantages of the invention are discussed below in conjunction with the preferred embodiments.

DETAILED DESCRIPTION OF THE PRESENTLY PREFERRED EMBODIMENTS

One of the most critical parameters for the design of fast signal processing systems is the combined bandwidth of all of the components in the signal path and the resulting signal distortion and loss of signal amplitude. The signal path is defined as the path, i.e. circuits and connections, that the input signal to be processed, e.g. amplified, follows, up to the outputs where the signal is passed to a subsequent processing/circuit stage. Two types of variable gain amplifier ("VGA") architectures, closed loop and open loop, are generally available for incorporation into such signal processing systems. Closed loop VGA's maintain signal gain and circuit stability via a feedback loop in the signal path which re-circulates the amplified output signal, typically through an operational amplifier and resistive network. Open loop VGA's, on the other hand, do not use a feedback loop in the signal path and, instead, rely on externally generated signals to regulate signal gain and circuit stability.

Figure 1:
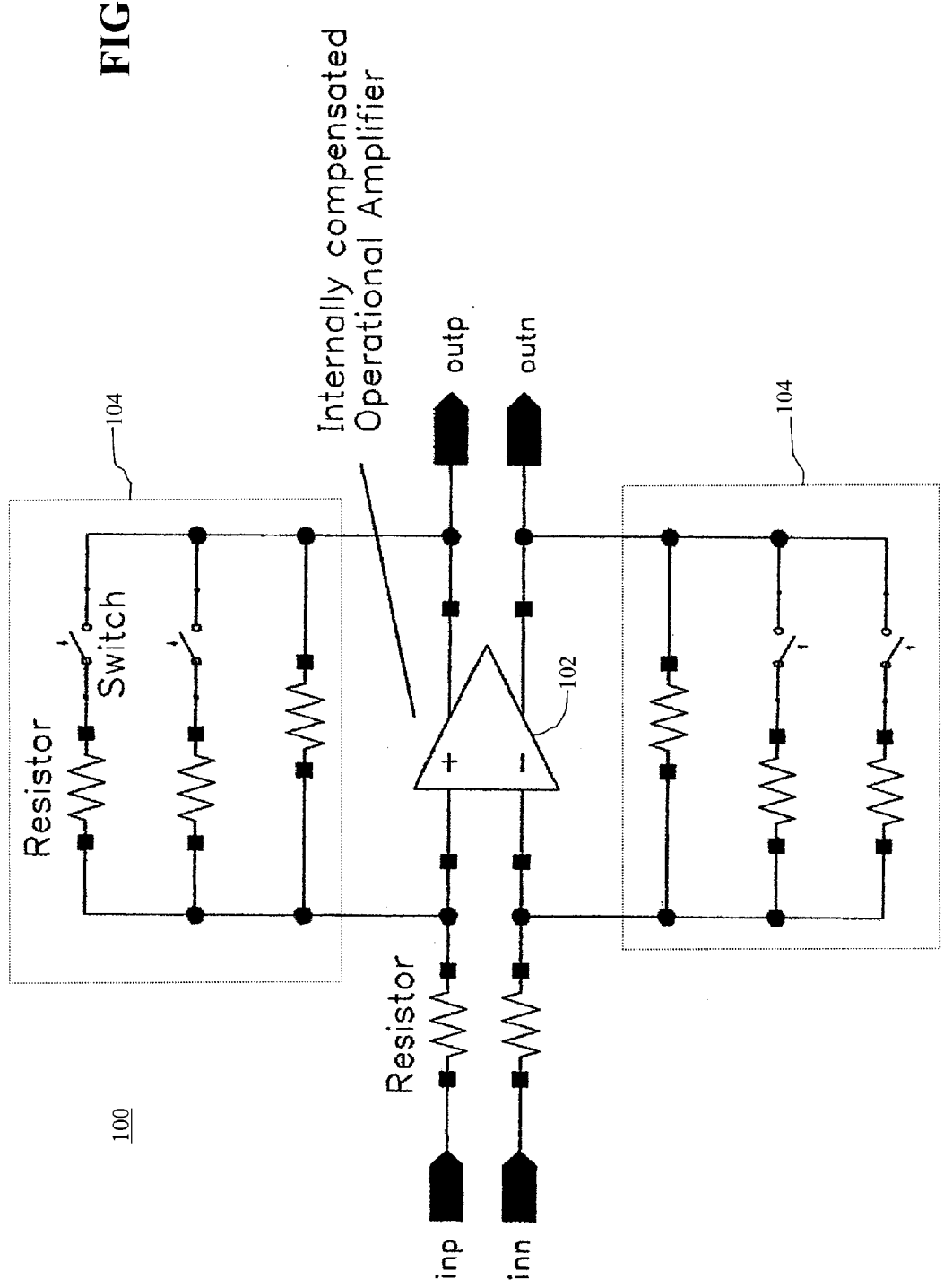
FIG. 1 depicts a closed loop variable gain amplifier.

FIG. 1 shows a closed loop variable gain amplifier ("VGA") 100 for differential signals, described below, as known in the art. The closed loop VGA 100 includes an operational amplifier 102 coupled with a programmable resistive feedback network 104. The differential outputs of the operational amplifier 102, labeled "outp"and "outn", are each coupled with their own programmable resistive feedback network 104. Herein, the phrase "coupled with" is defined to mean directly connected to or indirectly connected through one or more intermediate components. Each programmable resistive feedback network 104 is further coupled with the corresponding inputs of the operational amplifier 102. The programmable resistive feedback network 104 features programmably switchable resistance values which can be used to adjust the combined/overall resistance of the network 104. It will appreciated by those skilled in the art that this VGA 100 requires an internally compensated, complex operational amplifier 102 inside the loop. This is because most operational amplifiers can be viewed as second-order systems, since they contain at least two internal high impedance nodes. In order to keep a second-order system from oscillating it has to be guaranteed by design that the voltage gain from input to output of the circuit has rolled off to less than 0 dB, once the output phase goes close to −180 degrees. Furthermore, it is required that the gain has rolled off to 0 dB well before the phase reaches −180 degrees (typically more than 65 degrees, the so-called "phase margin") in order to reduce settling time and minimizes ringing of the amplifier output. Circuit techniques that implement this functionality are called "compensation techniques."

It will further be appreciated that the VGA 100 and its overall circuit loop must be compensated to remain stable during gain changes. This is typically accomplished by designing the amplifier circuitry such that the entire circuit (amplifier plus feedback network) is prevented from oscillation, i.e. kept stable. Known techniques such as "Pole Splitting" or "Dominant Pole Compensation" may be utilized. This, therefore, limits the speed of the signal processing that can be achieved because stabilizing (by compensating) an operational amplifier typically requires introducing low-pass behavior into the signal path in order to decrease the amplifiers tendency to oscillate or ring. Since a low pass filter attenuates high frequencies it also decreases the bandwidth and the speed of the overall system.

In addition, for each gain setting of the closed loop VGA 100, the loop stability has to be guaranteed, and important loop parameters, such as the −3 dB bandwidth and settling time, usually vary significantly for different gain settings. Further, it continuously gets harder to scale the operational amplifiers used in closed loop VGA's 100 down to operate on smaller supply voltages while maintaining the gain-bandwidth product.

For a given implementation/fabrication technology, such as complementary metal oxide semiconductor ("CMOS"), a typical closed-loop topology VGA will further show both small-signal and large-signal limitations due to its limited, approximately −3 dB, bandwidth and its finite internal slew rate. Slew rate defines the maximum rate at which the output of a circuit is able to follow a fast-changing input signal. At a certain maximum input slope, the output of the circuit is not able to follow anymore and is said to "slew". The rate of change of the output voltage stays at this maximum, constant rate, even for faster input rise/fall-times. Slew rate is specified in Volts/second ("V/s"). It will be appreciated that CMOS processes include processes which use metal gates as well as polysilicon gates. It will further be appreciated that other process technologies and feature sizes may used and that the circuitry disclosed herein may be further integrated with other circuitry.

To get the maximum speed from a given CMOS technology, it is therefore desirable to move to an open loop topology, reducing the number of speed critical internal circuit nodes in the VGA. One example of an open loop architecture uses a degenerated differential transistor pair with resistive loads and a boosted gain source follower. For more detail on this type of variable gain amplifier, refer to J. J. F. Rijns, "CMOS Low-Distortion High-Frequency Variable Gain Amplifier", IEEE Journal of Solid-State Circuits, Vol. 31, No. 7, July 1996, pp. 1029–1034 ("Rijns"). However, even open-loop implementations, as described in Rijns, suffer certain speed penalties from the existence of several internal circuit nodes and their associated parasitic poles.

Another important design parameter in VGA design arises from the fact that the voltage signals to be sampled by a data converter typically arrive with small amplitudes and therefore are required to be amplified in order to be in the ideal input voltage range for further signal processing. The voltage gain of the VGA should be well defined and maintained independent of process tolerances, temperature and supply voltage variations. Process tolerances include unpredictable or expected but unavoidable variations that occur in the feature geometries and materials of the integrated circuits during fabrication which do not jeopardize device operation. These variations may appear as feature, e.g. circuit component, size discrepancies, alignment discrepancies, or doping discrepancies, etc. Such variations can affect actual electrical operating properties of the various circuits and cause them to deviate from their ideal/designed values thereby reducing efficiency, operating speed, etc without rendering the device completely non-functional. Temperature variation may occur due to environmental factors in the operational environment of a device. Supply voltages may vary due to environmental conditions, poorly designed or poorly implemented system power supplies, etc. Ideally, the VGA gain should be insensitive to such variations so as to provide predictable operation under varying conditions. This has the additional benefit of improving fabrication yield by increasing the tolerance margin for operational devices.

Further, differential signaling is preferably used in analog circuit design. Signals that are represented by the difference between two voltages or currents are referred to as differential signals. In effect, differential inputs subtract two input signals, a positive and a negative, from each other. A positive signal is represented when the positive input is greater than the negative input and a negative signal is represented when the negative signal is greater than the positive. When the positive input is equal to the negative input, the signal represented is zero. The result is lower noise as noise will typically be present on both inputs and will be subtracted away, leaving just the signal. Differential signals may be used to represent both binary and analog signals. For both binary and analog signals, differential signals also offer the advantage of a requiring a lower voltage swing to represent signal values, allowing for faster switching. Further, differential signals simplify grounding in a system as the signal is not derived from comparing one input with a ground reference.

With differential signals, it is important to control the common mode voltage level within the VGA and at its outputs being interfaced to the next signal processing stage, typically some form of data converter as described above. The common mode voltage is the base voltage level around which the differential voltage swing is centered. For a zero differential signal (0.0 Volts) (with no noise), both differential inputs sit at the common mode voltage level. A data converter usually features a particular voltage range for the required input common mode voltage of the VGA circuit. This range should be maintained independent of process tolerances, temperature and supply voltage variations to allow for proper operation. To maintain the common mode voltage within the proper range, it must be continually servoed to a programmable reference, i.e. continuously compared and adjusted to substantially equate to the programmable reference value via a feedback mechanism.

Disclosed herein is a fully integrated, fast open-loop variable gain amplifier with independent control over the output common-mode voltage level and the voltage gain from differential input to output by using a replica gain cell as a reference. The disclosed embodiments feature an open loop architecture which avoids complex circuitry such as operational amplifiers, switches and gain-setting resistors in the signal path by using simple gain setting elements, thereby increasing signal speed. Further, the disclosed embodiments feature continuously active gain and common mode servo loops which operate on a replica gain cell without interfering with the fast amplification operation in the signal path. These gain varying elements and common mode sensing elements are located in the replica gain cell, therefore the gain cells located in the signal path have no internal circuit nodes. This reduces the number of parasitic poles in the VGA significantly, and therefore increases the bandwidth of the VGA. The disclosed embodiments are also capable of operating with small supply voltages, i.e. 1.5V to 1.8V for a CMOS technology with 0.18 micron minimum feature size, without the need for stacked elements, such as cascode transistors, to reach the required gain bandwidth product. The gain bandwidth product is multiplication of voltage gain times the −3 dB bandwidth of a circuit. Typically, a certain voltage gain in combination with a certain bandwidth, i.e. speed, is required, but there exists a trade-off between available gain and bandwidth, meaning for a given technology and circuit architecture, the gain bandwidth-product is constant.

Further, as will be described, the VGA gain is controlled by a gain servo loop which defines the VGA gain by a precise device ratio and continuously servoes it to a precise reference external to the gain cell, where the gain servo loop is not allowed to interfere with the amplification process. This further renders the gain control insensitive to process, temperature and supply voltage variations.

Figure 2:
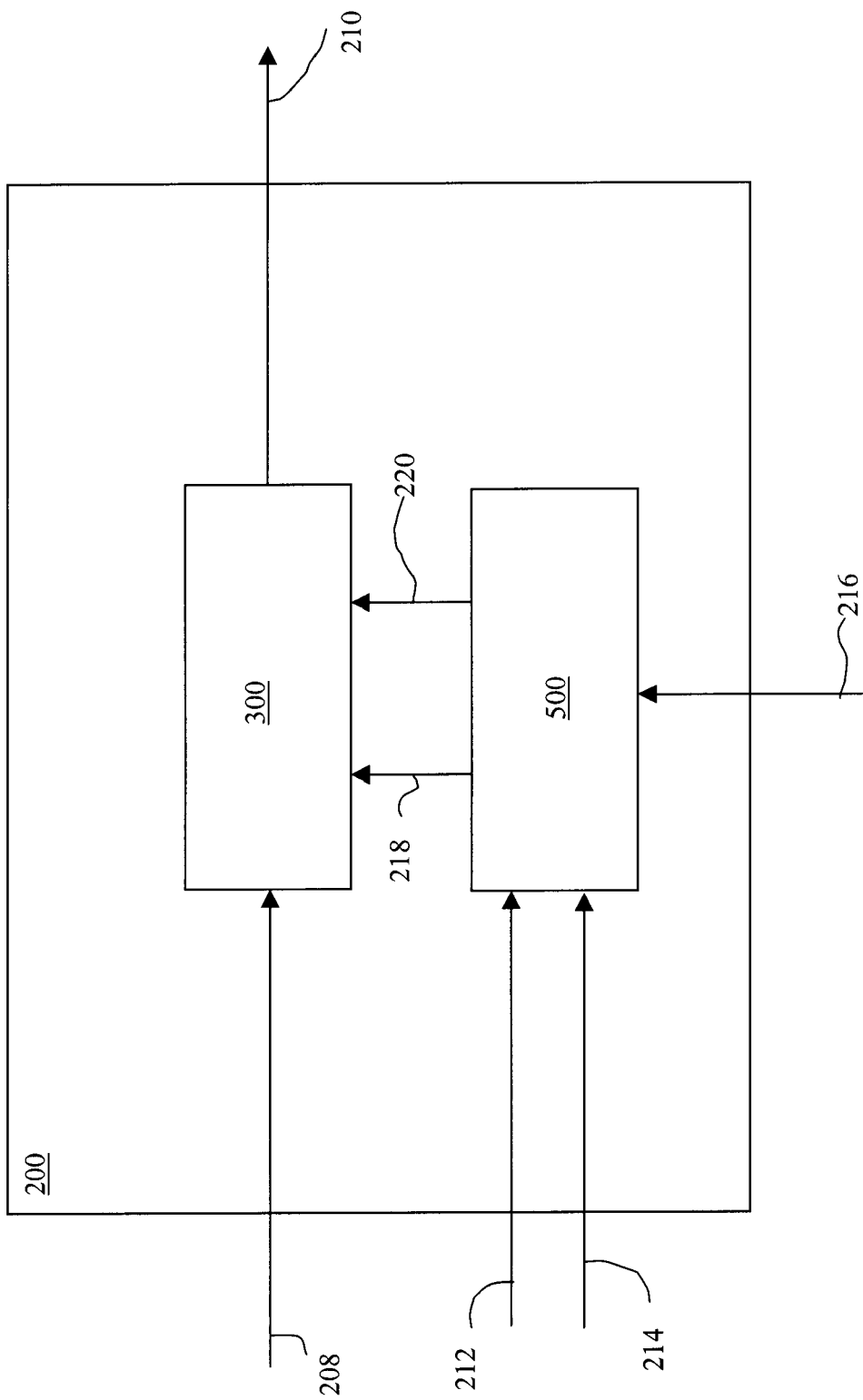
FIG. 2 depicts an open loop variable gain amplifier according to a first embodiment.

FIG. 2 shows one embodiment of an open loop variable gain amplifier ("VGA") 200 for differential signals which uses a replica gain cell circuit 500 to control and regulate the gain as well as the common mode voltage of the gain cells 300. The open loop VGA 200 includes an arrangement 300 of gain cells to amplify the input signal. The gain cell arrangement 300 includes a differential signal input 208 and a differential signal output 210. The gain cell arrangement is further described below and in FIGS. 3 and 4. The open loop VGA 200 further includes a replica gain cell circuit 500 coupled with the gain cell arrangement 300. The replica gain cell circuit 500 includes inputs for a gain reference voltage 212, a common mode voltage reference 214 and a programmable gain control 216. In one embodiment, the gain control 216 is a digital control signal. The replica gain cell circuit 500 further includes control outputs 218, 220 coupled with the gain cell arrangement 300 to control the gain and the output common mode voltage level of the gain cell arrangement 300. The replica gain cell circuit 500 is further described below and in FIG. 5.

Figure 3:
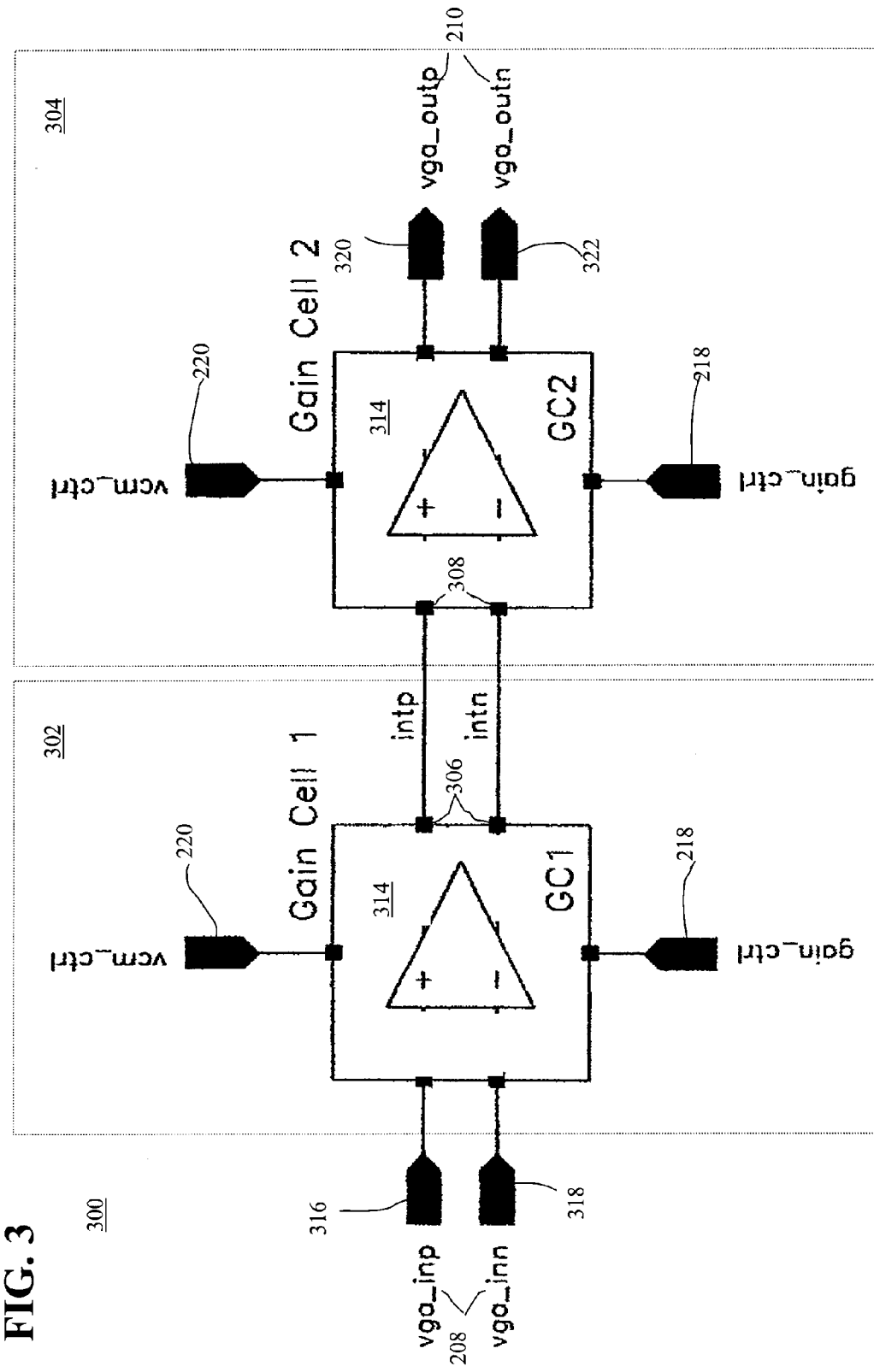
FIG. 3 depicts a gain cell arrangement for use with the embodiment of FIG. 2.

FIG. 3 shows a circuit diagram of a gain cell arrangement 300 for the open loop VGA 200 shown in FIG. 2. The arrangement 300 includes two identical differential gain cells 314 coupled in series, i.e. the outputs 306 of the first gain cell 302 are connected to the inputs 308 of the second gain cell 304. The first gain cell 302 provides the differential inputs 208 (316, 318) of the open loop VGA 200. The second (or last in the series) gain cell 304 includes the differential outputs 210 (320, 322) of the open loop VGA 200. Each gain cell 302, 304 further includes inputs for the gain control 218 and common mode voltage control 220 outputs of the replica gain cell circuit 500. The gain cell 302, 304 is described in more detail below and in FIG. 4. The connection nodes 306/308, labeled "intp" and "intn", are the only internal nodes in the signal path, defined as the circuit path that an input signal travels from the inputs 208 to the outputs 210, adding only one high frequency parasitic pole to the VGA 200. This parasitic pole is defined by the output resistance and parasitic output capacitance of the first gain cell 302 in combination with the input capacitance of the gain cell 304. The parasitic pole can be moved out to very high frequencies by careful device sizing of the gain cell 302, 304. To reach high frequencies, the RC time constant of this VGA-internal parasitic pole has to be made as small as possible. The output resistance, R, of the first gain cell is dominated by the load resistors 410, 412 in series with the load transistors 406, 408. The smaller this combined series resistor can be made, the faster the VGA circuit can operate. The effective capacitance, C, to ground is dominated by the gate area of the input transistors 402, 404 of the second gain cell 304. The smaller the width and the length of these transistors, the faster the circuit can operate. For a 0.18 micron CMOS technology −3 dB, frequencies up to 1.5 GHz can be achieved. It will be appreciated that to achieve higher overall gain from the open loop VGA 200, more than two gain cells 314 may be cascaded in series as described.

Figure 4:
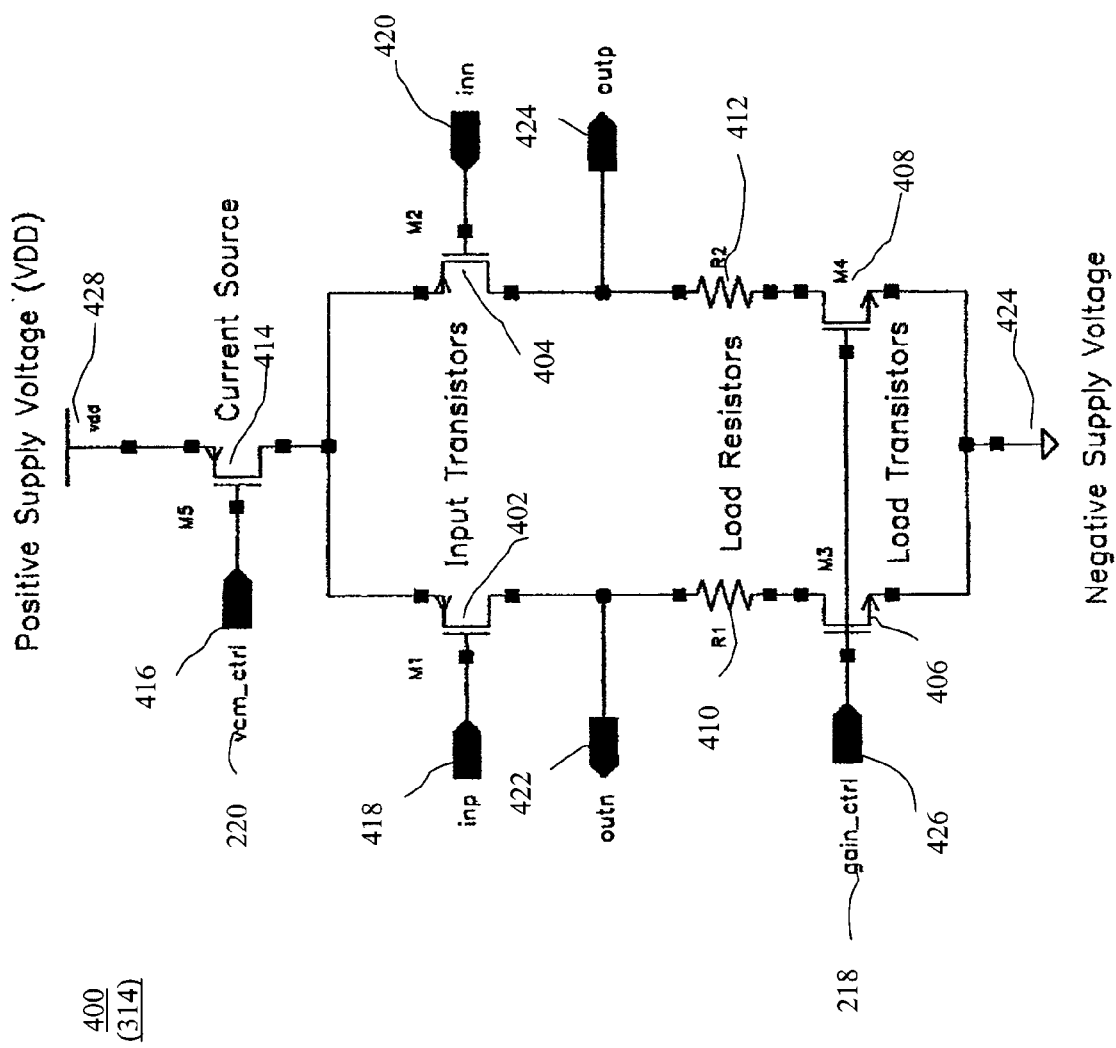
FIG. 4 depicts a circuit diagram of the gain cell of FIG. 3.

FIG. 4 shows a circuit diagram 400 of a gain cell 314 for use in the gain cell arrangement 300 shown in FIG. 3. The gain cell 302, 304 includes a PMOS differential input transistor pair 402, 404, labeled "M1" and "M2." The gates of the input transistors 402, 404 are coupled with the gain cell 400 inputs 418, 420, labeled "inp" and "inn." The drains of the input transistors are coupled with the fixed load resistors 410, 412, labeled "R1" and "R2" and described in more detail below, and with the gain cell 400 outputs 422, 424, labeled "outn" and "outp." The sources of the input transistors 402, 404 are coupled with a tail current source transistor 414. The gate 416 of the tail current source transistor 414 is coupled with the common mode voltage control 220 from the replica gain cell circuit 500. The source of the tail current source transistor 414 is coupled with a positive power supply 428. In one embodiment, the voltage range of the positive power supply 428 is 1.5 V to 1.8 V for a 0.18 micron CMOS technology.

The load transistors 406, 408, labeled "M3" and "M4", are connected in series with the load resistors 410, 412 and are configured so as to operate in the triode, i.e. non-saturation, region. The fixed load resistors 410, 412 reduce the voltage drop across the load transistors 406, 408, effectively reducing the drain to source voltage, this helps keep the load transistors 406, 408 from entering the saturation region even in the presence of large voltage swings. The values of the load resistors 410, 412 are implementation dependent. In one embodiment, the load resistors 410, 412 have a resistance in the range of 500 Ohms to 10 KOhms.

The common mode voltage of the gain cell 400 is defined via the tail current source 414, labeled "M5", which is controlled by the gate voltage as applied by the common mode voltage control signal 220 from the replica gain cell circuit 500. The gain of the gain cell 400 depends on the ratio of the input transistor 402, 404 size versus the combined load resistance of the fixed resistors 410, 412 and the load transistors 406, 408 and thus can be controlled via the gate voltage of the load transistors 406, 408 as applied by the gain control signal 218 from the replica gain cell circuit 500. It will be appreciated that other process technologies, such as NMOS may be used for the input transistors 402, 404, or PMOS for the load transistors 406, 408 and tail current source transistor 414.

Figure 5:
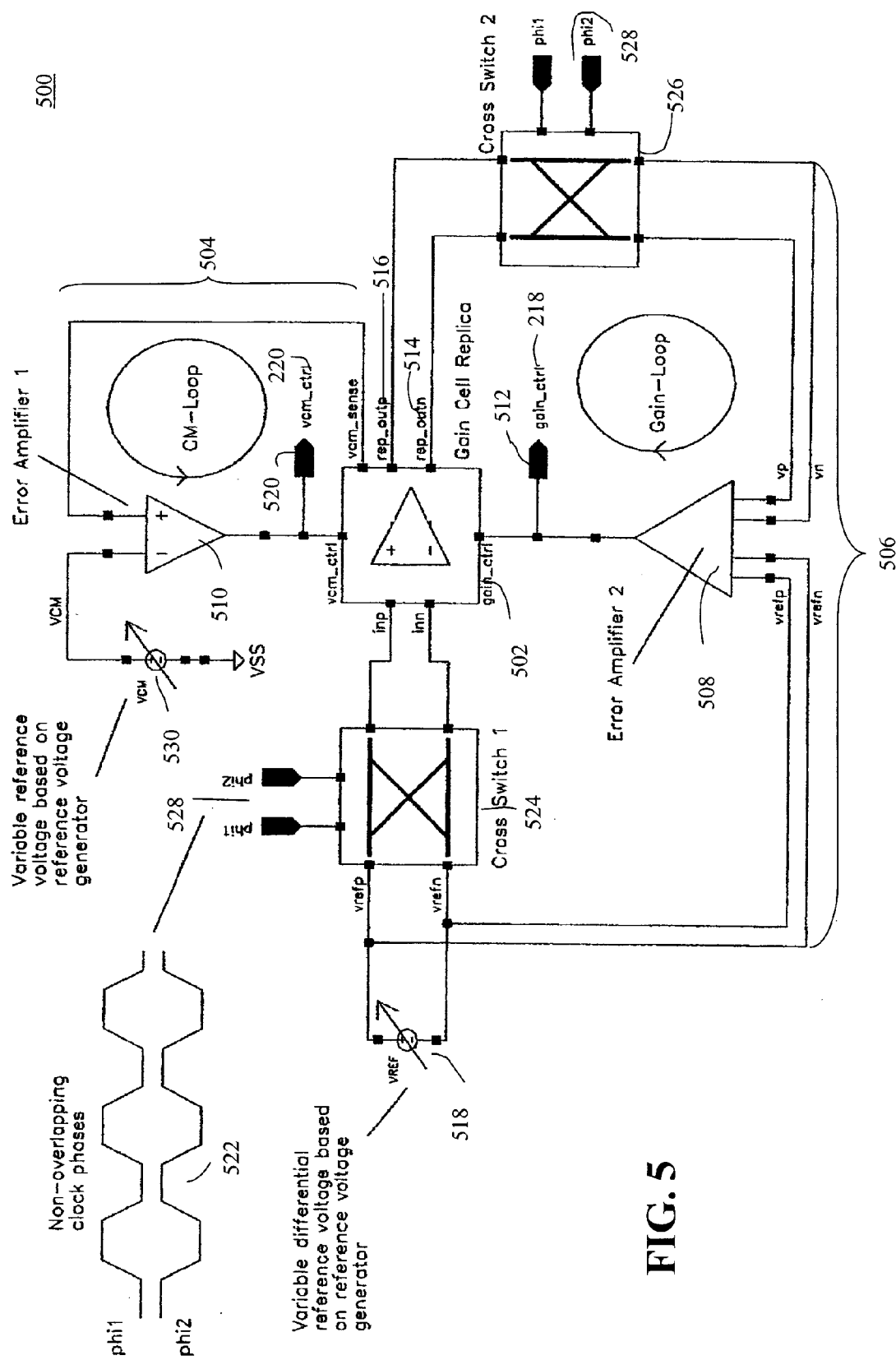
FIG. 5 depicts a circuit diagram of a replica gain cell circuit for use with the embodiment of FIG. 2.

FIG. 5 shows a circuit diagram of a replica gain cell circuit 500 for use with the open loop VGA 200 shown in FIG. 2. The circuit 500 includes two independent servo feedback loops 504, 506 coupled with a replica gain cell 502. In a master/slave configuration, the two servo loops, a common mode voltage loop 504 and a gain loop 502, independently set the gain and the common mode voltage level of a replica gain cell 502. The control signals for the common mode voltage control 220 and gain control 218 are derived from these servo loops 502, 504.

The gain loop 506 includes a variable differential reference voltage source 518, first and second cross switches 524, 526, described in more detail below and in FIG. 8, and an error amplifier 508. The voltage sources 518 may be supplied by a reference voltage generator external or internal to the open loop VGA 200. Each cross switch 524, 526 is coupled with a two phase non-overlapping clock signal 522 via inputs 528. The clock generator (not shown) may be external or internal to the VGA 200.

The differential reference voltage 518, labeled "VREF," is preferably set to the expected full signal amplitude at the open loop VGA 200 input 208. The set differential reference voltage 518 is applied to the input of the gain cell replica 502, shown in more detail in FIG. 6. The gain loop 506, using the Error Amplifier 2 508, servoes the voltage on the node labeled "gain_ctrl" until the differential output voltage of the replica gain cell 502 available on the nodes labeled "rep_outn" and "rep_outp" equals the voltage VREF 518. This gain value will be dependent upon the gain setting of the replica gain cell 502, as described below. The loop maintains this gain setting independently of process tolerances, temperature and supply voltage variations as the servo loop accounts for such variations using the reference voltage 518. In one embodiment, the reference voltage 518 is external to VGA 200. In an alternate embodiment, the reference voltage 518 is generated internally and is preferably in the range of the signals being processed in the signal path, more preferably at the maximum signal voltage level. The resultant voltage applied to the gain_ctrl node by the error amplifier 508 is also output on the gain_ctrl output 512 which is coupled with the gain_ctrl inputs 426 of the gain cells 302, 304. In this way, the appropriate gain control voltage is applied to the load transistors 406, 408 of the gain cells 302, 304 and appropriately compensated for process, temperature and supply voltage variations which would affect the gain cells 302, 304 and the replica gain cell 502 similarly.

The common mode voltage loop 504 includes a variable common mode reference voltage source 530 and an error amplifier 510. The voltage sources 530 may be supplied by a reference voltage generator external or internal to the open loop VGA 200. The common mode voltage control loop 504 servoes the output voltage of the error amplifier 510, labeled "vcm_ctrl", until the output common mode voltage, labeled "vcm_sense", equals the set voltage of the voltage source 530. In one embodiment, the voltage of the voltage source 530 is programmable. This allows programming of the output common mode level to the requirements of the specific circuit stage that follows, i.e. is connected with, the open loop VGA 200, independently of the gain setting. The common mode voltage loop 504 maintains the common mode level independently of process tolerances, temperature and supply voltage variations. The common mode control loop increases or decreases the tail current in the gain cell replica 502 in such a way that the sensed output common mode voltage 636 converges to the common mode reference voltage 530. If, for example, the sensed common mode voltage 636 should be lower than the reference voltage 530, the resulting negative output voltage 520 of the error amplifier 1 510 increases the gate-source voltage of the current source 610. This increases the tail current which in turn develops a larger common mode voltage across the load resistors 620, 622. The tail current increases until the sensed common mode voltage 636 equals the common mode reference voltage 530. For output common mode voltage levels lower than the reference the loop operates in the opposite direction, effectively decreasing the tail current.

Figure 6:
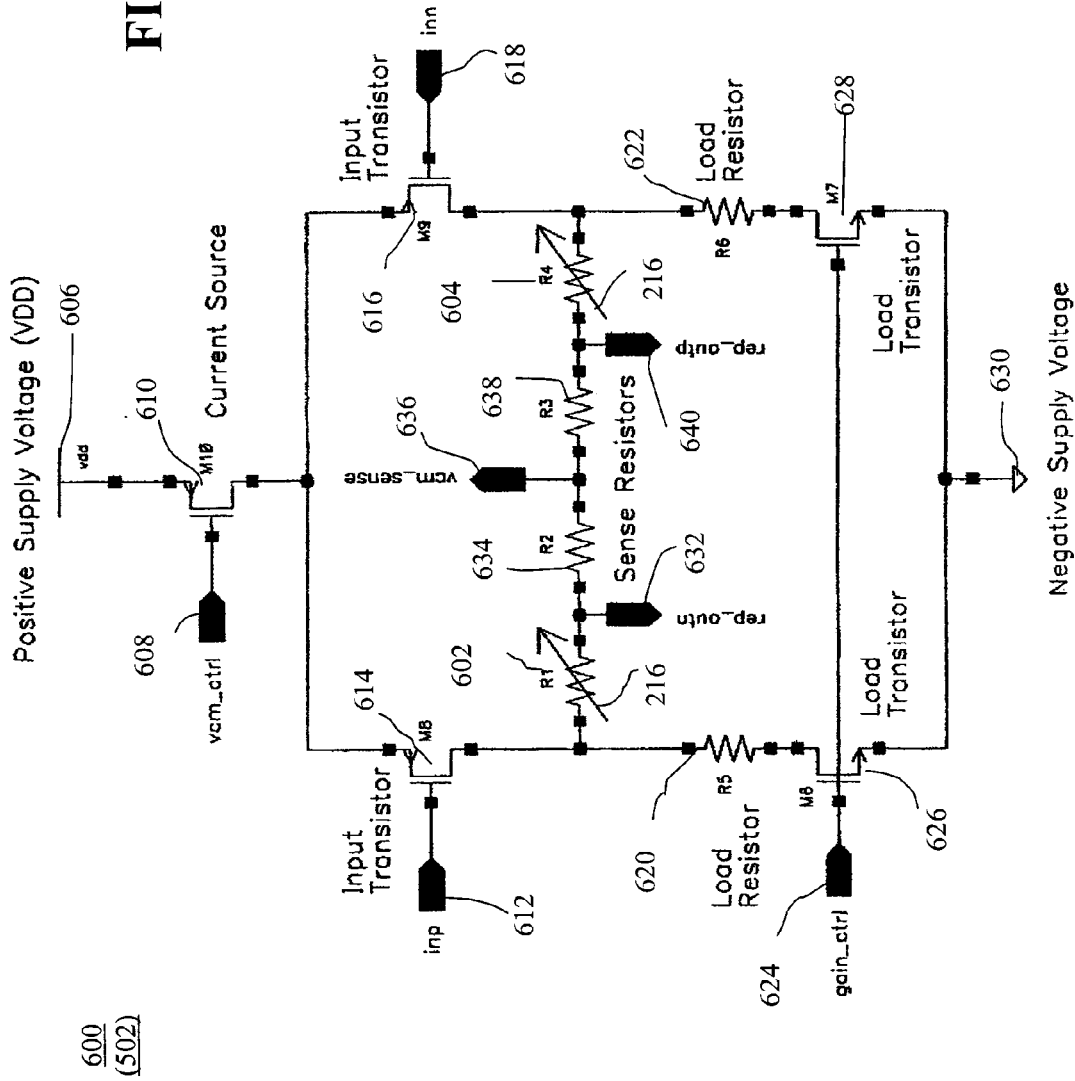
FIG. 6 depicts a circuit diagram of a programmable gain cell for use with the circuit of FIG. 5.

FIG. 6 shows a circuit diagram of an exemplary programmable differential gain cell 600 for use as the replica gain cell 502 in the replica gain cell circuit 500 shown in FIG. 5. The programmable gain cell 600 includes a current source 610, a pair of differential input transistors 614, 616, a set of tapped sense resistors 602, 604, 634, 638, labeled "R1", "R2", "R3" and "R4", a pair of load resistors 620, 622, labeled "R5" and "R6", and a pair of load transistors 626, 628. The source of the current source 610 is coupled with a positive voltage supply 606 and the gate is coupled with the common mode control voltage input 608 which is generated by the common mode voltage loop 504 (as shown in FIG. 5). In one embodiment, the positive voltage supply 606 ranges from 1.5 V to 1.8 V for a 0.18 micron CMOS technology. The drain of the current source 610 is coupled with the sources of the input transistors 614, 618. The gates of the input transistors 614, 616 are coupled with the differential signal inputs 612, 618 which are coupled with the voltage reference 518 and gain loop 506 via a cross switch 524 (as shown in FIG. 5). Each of the drains of the input transistors 614, 616 are coupled with the one end of the set of tapped sense resistors 602, 604, 634, 638 and also with the load resistors 620, 622. The load resistors 620, 622 are further coupled with the drains of the load transistors 626, 628. The gates of the load transistors 626, 628 are both coupled with a gain control input 624 generated by the gain loop 506 (as shown in FIG. 5). The sources of the load transistors 626, 628 are coupled with a negative supply voltage 630, which is preferably grounded or 0.0 Volts. Differential replica gain sensing outputs 632, 640, labeled "rep_outn" and "rep_outp", are coupled between sense resistors R1 602 and R2 634 and between sense resistors R3 638 and R4 604. The rep_outn 632 and rep_outp 640 are coupled with the rep_outp 516 and rep_outn 514 inputs to the gain loop 502 via cross switch 526 (as shown in FIG. 5). Sense resistors R1 and R4 602, 604 are variable and coupled with the gain control input 216. The sense resistors R1 and R4 603, 604 may be used to adjust the gain of the programmable differential gain cell 600 via the gain control input 216, as described below, to vary their resistance and, thereby, the gain of the replica gain cell 600 (502). A common mode voltage sense output 636, labeled "vcm_sense", is coupled between sense resistors R2 634 and R3 638. The vcm_sense output 636 is coupled with the common mode voltage loop 504 (as shown in FIG. 5).

The gain of the gain loop 506/replica gain cell 502, and therefore of the gain cells 302, 304, depends on the ratio of the sense resistors 602, 604 to the sense resistors 634, 638 in the replica gain cell 502 (see FIG. 6), labeled "R1", "R4" and "R2", "R3." Where R1=R4 and R2=R3, gains larger than unity may be achieved. For example, shorting out R1 602 and R4 604 close to zero Ohms results in unity gain while sizing R1=R2=R3=R4 results in a gain of 6 dB. In one embodiment, sense resistors 602, 604, 634, 638 are in the range of 50 KOhms to 100 KOhms. The sense resistors 602, 604, 634, 638 together with the voltage taps 632, 640 comprise a differential voltage divider. The resulting gain of the gain cell replica 502 is inversely proportional to the attenuation factor of this voltage divider. For example, sizing R1=R2=R3=R4=50K Ohms attenuates the reference voltage 518 by a factor of 2.0 (−6 dB). Since the gain servo loop 506 continually equalizes the output voltage 514, 516 of the gain cell replica 502 to the reference voltage 518 by increasing or decreasing the gain of the gain cell replica 502, the loop will change the gain control voltage 512 until the gain cell replica has an effective gain of 6 dB. The gain of the gain cell replica 502 is changed such as to equalize the attenuation of the resistive voltage divider.

Thus, the gain of the open loop VGA 200 is varied by varying the ratios of tapped resistors R1 and R4 (where R1=R4, R2=R3) in the gain cell replica 502. An exemplary implementation of a variable resistor ratio, shown in FIG. 7 and described in more detail below, includes digitally switching in different resistor ratios. To further allow the open loop VGA 200 to work with a priori unknown input voltage ranges, the reference voltage VREF 518 may be also made programmable.

Figure 7:
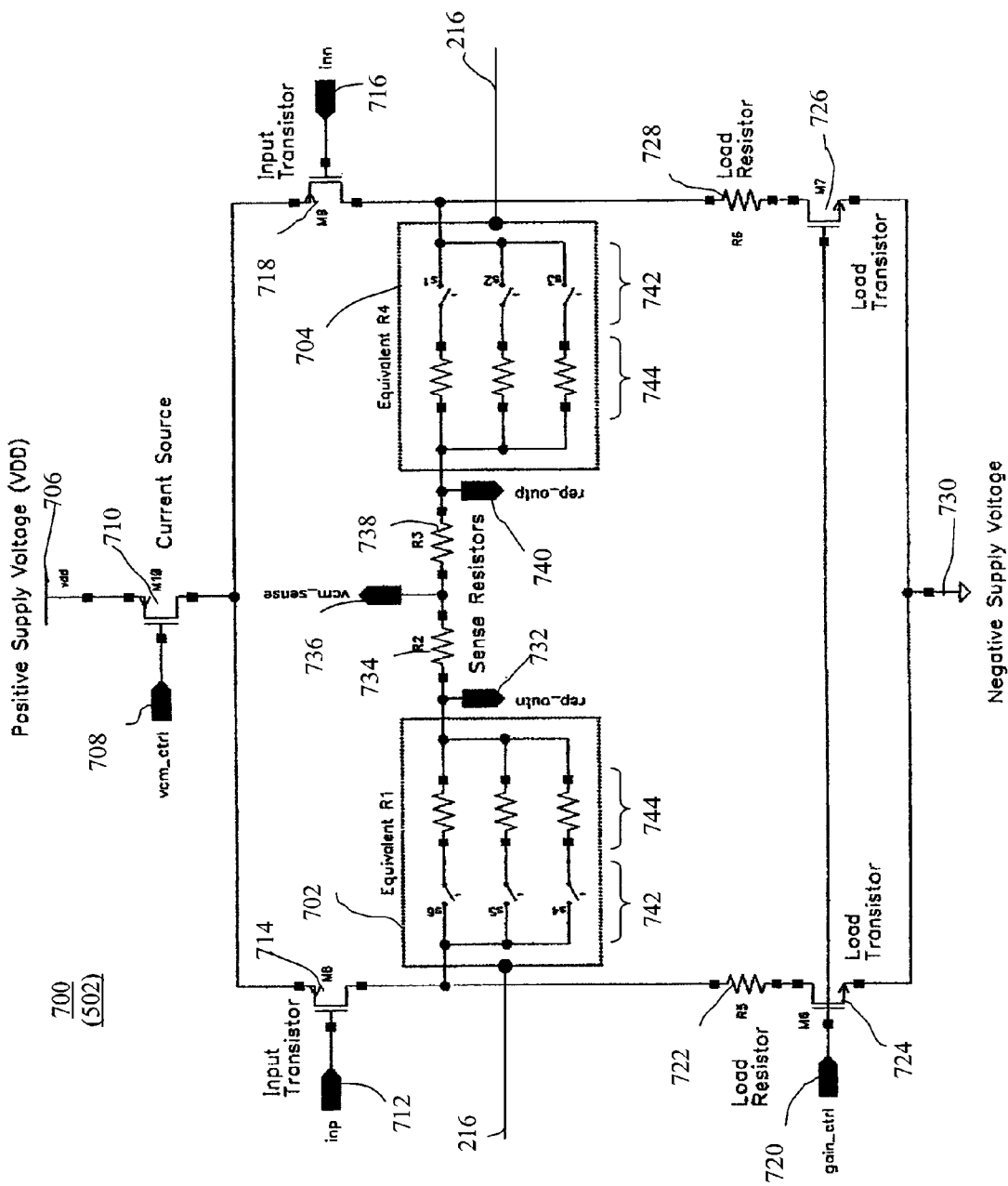
FIG. 7 depicts a circuit diagram of a digitally programmable gain cell for use with the circuit of FIG. 5.

FIG. 7 shows a circuit diagram of an exemplary digitally programmable gain cell 700 (502) for use with the replica gain cell circuit 500 shown in FIG. 5. The gain cell 700 is similar to the gain cell 600 shown in FIG. 6 except that the variable sense resistors R1 and R4 602, 604 have been replaced with digitally variable resistance networks 702, 704. Each network 702, 704 consists of multiple resistance branches 744 and switch elements 742 coupled in a parallel fashion which are capable of optionally connecting the resistance branches 744 to the network 702, 704. Each network 702, 704 is coupled with the gain control signal 216 which is preferably a digital signal operative to control the switches 744. Depending upon the value of the digital gain control signal 216, various combinations of parallel resistance branches 744 are switched into the network 702, 704 to create an overall resistance value which controls the gain of the gain cell 700 as described above.

Referring back to FIG. 5, by adding low frequency chopping of the inputs and outputs of the gain cell replica 502 with cross-switches 524, 526, the DC-offset of the differential input pair in the replica gain cell 502 can be cancelled out. The cross switch 524, 526, shown in FIG. 8, being controlled via two non-overlapping clocks, φ 1 and φ 2, either passes the differential inputs straight through, "a" to "c" and "b" to "d", or interchanges them, "a" to "d" and "b" to "c".

Figure 8:
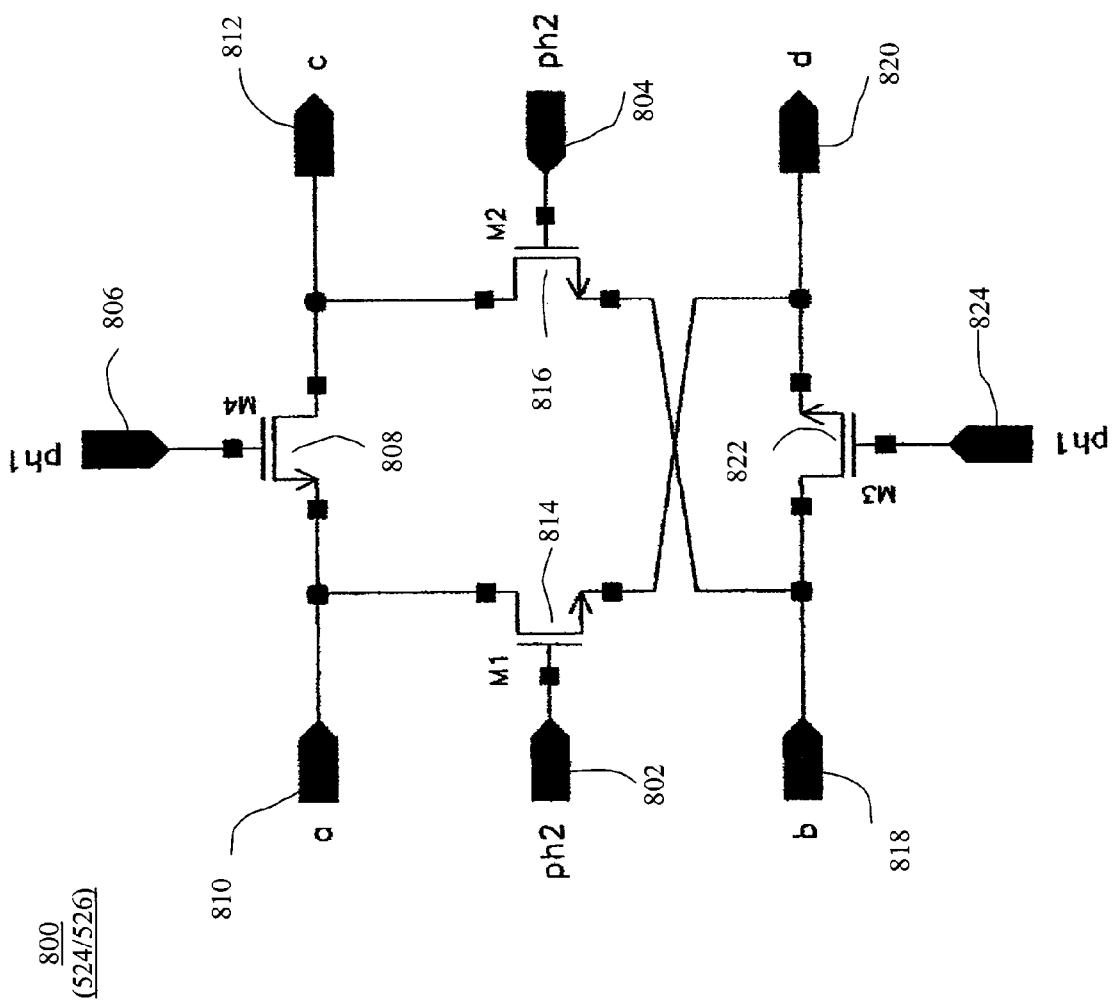
FIG. 8 depicts a circuit diagram of a cross-switch for use with the circuit of FIG. 5.

FIG. 8 shows a circuit diagram 800 of an exemplary cross switch 524, 526 for use with the replica gain cell circuit shown 500 shown in FIG. 5. The circuit 800 includes inputs 810, 818, labeled "a" and "b" and outputs 812, 820, labeled "c" and "d". The circuit further include a first transistor 808 coupled between input 810 and output 812, a second transistor 822 coupled between input 818 and output 820, a third transistor 814 coupled between input 810 and output 820 and a fourth transistor 816 coupled between input 818 and output 812. The gates 806, 824 first and second transistors 808, 822 are coupled with the first phase of the non-overlapping clock 522 and the gates 802, 804 of the third and fourth transistors 814, 816 are coupled with the second phase of the non-overlapping clock 522. In operation, the non-overlapping clock 522 will simultaneously alternately switch transistors 808 and 822 and transistors 814 and 816 on and off, effectively, alternately connecting input 810 to output 812 or output 820 and input 818 to output 820 or output 812. It will be appreciated that there may be other ways to build a circuit with similar cross-switching functionality.

The control voltages "gain_ctrl" 218 and "vcm_ctrl" 220 are distributed to the gain cells 302, 304 in the open loop VGA 200. Therefore the gain and common mode voltage loops 504, 506 continuously maintain voltage gain and common mode voltage level of the gain cells 302, 304 in the open loop VGA 200 despite variations in process tolerances, temperature or supply voltage variations.

Figure 9:
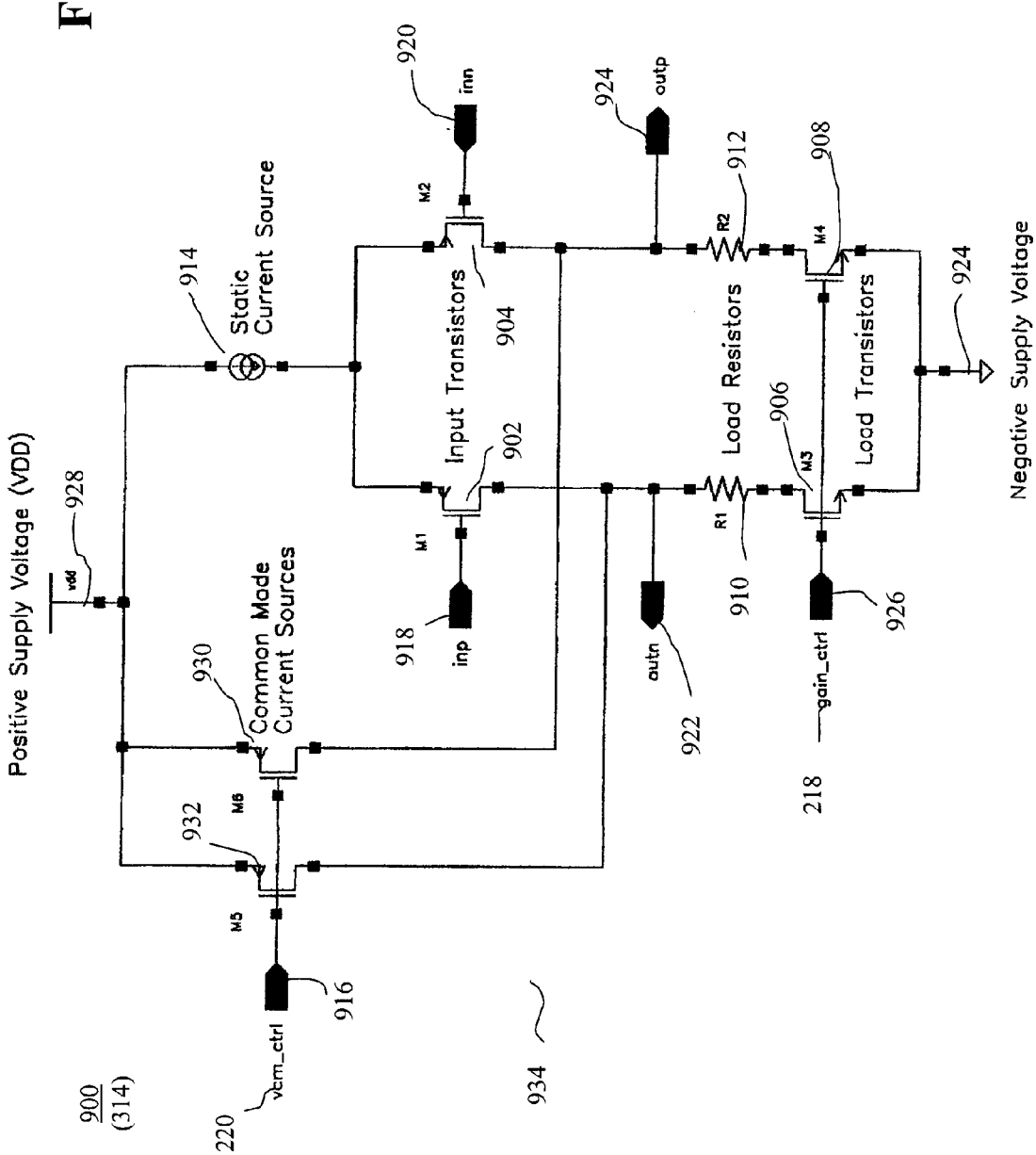
FIG. 9 depicts a circuit diagram of a gain cell for use with the arrangement of FIG. 3 according to a second embodiment.
Figure 10:
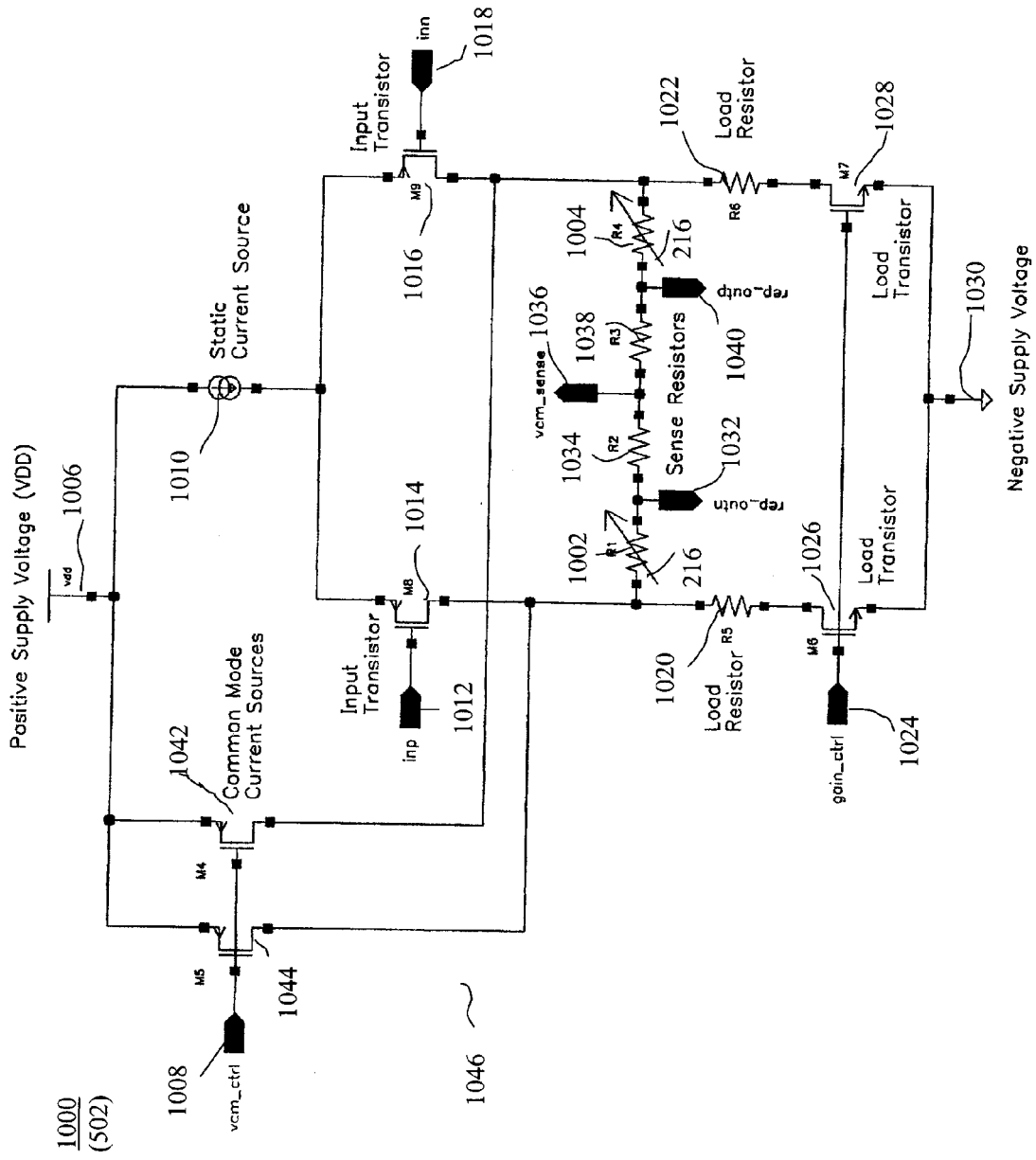
FIG. 10 depicts a circuit diagram of a replica gain cell circuit for use with the open loop variable gain amplifier of FIG. 2 according to a second embodiment.

FIG. 9 shows a circuit diagram of an alternative embodiment of the gain cell 900 (314) for use with the gain cell arrangement 300 shown in FIG. 3. The gain cell 900 is similar to the gain cell 400 shown in FIG. 4 except that an enhanced common mode voltage control circuit 934 is provided. The circuit 934 includes a positive supply voltage 928 coupled with a static current source 914 and the sources of first and second common mode current source transistors 930, 932. The gates of the transistors 930, 932 are coupled with the common mode voltage control signal 220 via input 916. The static current source 914 is further coupled with the sources of the input transistors 902, 904. The drains of the transistors 932, 934 are coupled with the drains of the input transistors 902, 904 and the load resistors 910, 912. FIG. 10 shows a circuit diagram of an alternative embodiment of the replica gain cell 1000 (502) for use with the gain cell 900 shown in FIG. 9 and the replica gain cell circuit 500 shown in FIG. 5. The replica gain cell 1000 is similar to the replica gain cell 600 shown in FIG. 6 except that an enhanced common mode voltage control circuit 1046 is provided. The circuit 1046 includes a positive supply voltage 1006 coupled with a static current source 1010 and the sources of first and second common mode current source transistors 1042, 1044. The gates of the transistors 1042, 1044 are coupled with the common mode voltage control loop 504 via input 1008. The static current source 1010 is further coupled with the sources of the input transistors 1014, 1016. The drains of the transistors 1042, 1044 are coupled with the drains of the input transistors 1014, 1016 and the load resistors 1020, 1022.

The common mode voltage control circuits 934, 1046 decouple the gain cell 900 gain range from the common mode voltage range by decoupling the differential transistor pair 902, 904 tail current from the common mode voltage current. The current sources 914, 1010 delivers the tail current to the differential input transistor pair 902, 904 and 1014, 1016. This tail current determines the effective voltage-to-current gain of the input transistor pair 902, 904 and 1014, 1016. The common mode voltage control signal 220 now controls two identical current sources, i.e. transistors 930, 932 and transistors 1042, 1044, which deliver variable currents to the loading resistors 910, 912 and 1020, 1022. The common mode voltage is developed across the loading resistors 910, 912 and 1020, 1022.

In the gain cell 400 and replica gain cell 600 described above, the voltage-to-current gain of the differential input transistors 402, 404 and 614, 616 was partially dependent upon the common mode controlling current. Since the voltage gain of the gain cell 400 depends upon the voltage-to-current gain of the differential transistor pair 402, 404, the gain range for a given common mode voltage was limited or the common mode voltage range was limited for a given gain.

Operation of the gain cell 900 and replica gain cell 1000 is the same as that for gain cell 400 shown in FIG. 4 and replica gain cell 600 shown in FIG. 6 and described in more detail above. Note that the digitally programmable resistance networks 702, 704 shown in FIG. 7 may be used similarly to replace the variable resistance 1002, 1004 shown in FIG. 10.

An open loop VGA 200 is described which may be used in any application where voltage signals must be amplified to certain voltage levels in order to allow subsequent signal processing of the those signals, such as analog signal/data processing, data conversion systems and data acquisition systems.

The disclosed VGA 200 features an open loop variable gain amplifier circuit using replica servo loops 504, 506 to slave output common mode voltage level and voltage gain independently from each other to precise electrical references. The VGA 200 voltage gain and common mode voltage are insensitive to process tolerance, temperature and supply voltage variations. Further, neither loop 504, 506 interferes with signal amplification and control of the common mode voltage is independent from control of the gain. The gain of the VGA 200 is defined by a precise resistor ratio in the gain cell replica 502 and is independently programmable by varying the resistance ratios. Further, the gain cell 302, 304 features a series-combination of a load resistor 410, 412 and a load transistor 406, 408, which allows the transistor 406, 408 to stay in the triode region even for a large signal amplitude.

The VGA 200 further features high speed and high bandwidth due to having no internal nodes in the signal path inside the gain cells 302, 304 and due to having only one internal pair of circuit nodes 306 between the two gain cells 302, 304. The VGA 200 also provides chopper-cancellation of gain cell replica 502 dc-offset in gain servo loop 506.

It is to be noted that suitable transistor sizes specifying channel width-to-length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

It is therefore intended that the foregoing detailed description be regarded as illustrative rather than limiting, and that it be understood that it is the following claims, including all equivalents, that are intended to define the spirit and scope of this invention.

I claim:

1. A variable gain amplifier comprising:
    at least one signal path gain cell comprising an open loop architecture and operative to amplify a differential input signal by a first gain according to a gain control signal; and
    a replica gain cell coupled with said at least one signal path gain cell and a gain input and operative to amplify a first reference signal according to said gain input and generate said gain control signal, said replica gain cell including a gain circuit operative to substantially equalize said amplified first reference signal to said first reference signal as a function of said gain input, said gain control signal being generated based on said equalization.

2. The variable gain amplifier of claim 1 wherein said gain input is programmable.

3. The variable gain amplifier of claim 2, wherein said programmable gain input comprises first and second programmable resistance networks operative to generate a precise resistance ratio to control said gain.

4. The variable gain amplifier of claim 1, wherein said replica gain cell further comprises a common mode voltage circuit operative to equalize a first common mode voltage of said replica gain cell with respect to a second external reference and generate a common mode voltage control signal based on said equalization to control a second common mode voltage of said at least one signal path gain cell.

5. The variable gain amplifier of claim 4, wherein said replica gain cell generates said gain control signal independently of generation of said common mode voltage control signal.

6. The variable gain amplifier of claim 4, wherein said second common mode voltage is insensitive to at least one of process tolerance, temperature variation and supply voltage variation.

7. The variable gain amplifier of claim 4, wherein said first gain is decoupled from said second common mode voltage.

8. The variable gain amplifier of claim 1, wherein said first gain is insensitive to at least one of process tolerance, temperature variation and supply voltage variation.

9. The variable gain amplifier of claim 1, wherein said at least one signal path gain cell comprises at least one load transistor coupled in series with at least one load resistor and operative to allow said at least one load transistor to operate in a triode region.

10. The variable gain amplifier of claim 1, wherein said at least one signal path gain cell lacks internal circuit nodes.

11. The variable gain amplifier of claim 1, wherein said replica gain cell operates without degrading amplification performance of said input signal.

12. A method of amplifying a signal comprising:
    (a) applying a gain control value to a replica gain cell corresponding to a selected gain of a signal path gain cell;
    (b) applying a first reference signal to said replica gain cell to be amplified;
    (c) equalizing, substantially, said amplified first reference signal to said first reference signal;
    (d) deriving an adjusted gain control signal based on said equalizing; and
    (e) applying said adjusted gain control signal to said signal path gain cell to achieve said selected gain.

13. The method of claim 12, wherein said equalizing further comprises adjusting, continuously, amplification of said first reference signal to maintain said amplified first reference signal substantially equal to said first reference signal and wherein said deriving further comprises deriving, continuously, said adjusted gain control signal.

14. The method of claim 12, wherein said equalizing further comprises accounting for variations in fabrication of said replica and signal path gain cells.

15. The method of claim 12, wherein said equalizing further comprises accounting for temperature variations in an environment in which said replica and signal path gain cells are operating.

16. The method of claim 12, wherein said equalizing further comprises accounting for variation in an operating supply voltage to said replica and signal path gain cells.

17. The method of claim 12, further comprising:
    (f) programming said gain control value.

18. The method of claim 12, further comprising:
    (f) programming said first reference signal.

19. The method of claim 12, further comprising:
    (f) applying a second reference signal to a common mode voltage control of said replica gain cell;
    (g) sensing a common mode voltage from an output of said replica gain cell;
    (h) equalizing, substantially, said common mode voltage to said second reference signal;
    (i) deriving an adjusted common mode voltage control signal based on said equalizing; and
    (j) applying said adjusted common mode voltage control signal to a common mode voltage control of said signal path gain cell.

20. The method of claim 19, further comprising performing (a), (b), (c), (d) and (e) independently from (f), (g), (h), (i) and (j).

21. The method of claim 19, wherein said equalizing of said common mode voltage further comprises adjusting, continuously, said common mode voltage to maintain said common mode voltage substantially equal to said second reference signal and wherein said deriving of said adjusted common mode voltage control signal further comprises deriving, continuously, said adjusted common mode voltage control signal.

22. The method of claim 19, wherein said equalizing of said common mode voltage further comprises accounting for variations in fabrication of said replica and signal path gain cells.

23. The method of claim 19, wherein said equalizing of said common mode voltage further comprises accounting for temperature variations in an environment in which said replica and signal path gain cells are operating.

24. The method of claim 19, wherein said equalizing of said common mode voltage further comprises accounting for variation in an operating supply voltage to said replica and signal path gain cells.

25. The method of claim 19, further comprising:

(f) programming said second reference signal.

26. An apparatus for variably amplifying an input signal comprising:

means for amplifying said input signal according to a first gain, said amplified input signal having a first common mode voltage;

means for amplifying a first reference signal according to an input gain and controlling said first gain based on an equalization of said amplified reference signal and said reference signal; and means for controlling said first common mode voltage according to a second reference signal based on a second common mode voltage of said amplified first reference signal.

27. The apparatus of claim 26 further comprising means for decoupling said first gain from said first common mode voltage.

* * * * *